(12) United States Patent
Armitage et al.

(10) Patent No.: US 11,626,538 B2
(45) Date of Patent: Apr. 11, 2023

(54) LIGHT EMITTING DIODE DEVICE WITH TUNABLE EMISSION

(71) Applicant: Lumileds LLC, San Jose, CA (US)

(72) Inventors: Robert Armitage, Cupertino, CA (US); Isaac Wildeson, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 206 days.

(21) Appl. No.: 17/190,762

(22) Filed: Mar. 3, 2021

(65) Prior Publication Data

US 2022/0140193 A1    May 5, 2022

Related U.S. Application Data

(60) Provisional application No. 63/107,111, filed on Oct. 29, 2020.

(51) Int. Cl.
*H01L 33/38* (2010.01)
*H01L 33/62* (2010.01)
*H01L 33/58* (2010.01)

(52) U.S. Cl.
CPC ............ *H01L 33/382* (2013.01); *H01L 33/58* (2013.01); *H01L 33/62* (2013.01)

(58) Field of Classification Search
CPC ............ H01L 3/382; H01L 3/58; H01L 3/62
See application file for complete search history.

(56) References Cited

U.S. PATENT DOCUMENTS

| 6,410,942 | B1 | 6/2002 | Thibeault et al. |
| 6,657,236 | B1 | 12/2003 | Thibeault et al. |
| 6,821,804 | B2 | 11/2004 | Thibeault et al. |
| 7,943,406 | B2 | 5/2011 | Slater, Jr. et al. |
| 8,222,811 | B2 | 7/2012 | Vaufrey et al. |
| 8,258,044 | B2 | 9/2012 | Brun et al. |
| 8,487,340 | B2 | 7/2013 | Gilet et al. |
| 8,638,032 | B2 | 1/2014 | Maindron et al. |
| 8,647,957 | B2 | 2/2014 | Borowik et al. |
| 8,697,548 | B2 | 4/2014 | Borowik et al. |
| 8,698,396 | B2 | 4/2014 | Maindron et al. |
| 8,754,426 | B2 | 6/2014 | Marx et al. |
| 8,890,111 | B2 | 11/2014 | Templier et al. |
| 8,969,900 | B2 | 3/2015 | Sabathil et al. |
| 9,093,607 | B2 | 7/2015 | Gilet et al. |
| 9,109,296 | B2 | 8/2015 | Metaye et al. |
| 9,112,112 | B2 | 8/2015 | Do et al. |

(Continued)

FOREIGN PATENT DOCUMENTS

| DE | 102010051286 A1 | 5/2012 |
| DE | 102012109460 A1 | 4/2014 |

(Continued)

OTHER PUBLICATIONS

PCT International Search Report and Written Opinion in PCT/US2021/051174 dated Jan. 26, 2022, 10 pages.

*Primary Examiner* — Mary Ellen Bowman
(74) *Attorney, Agent, or Firm* — Servilla Whitney LLC

(57) ABSTRACT

Described at light emitting diode (LED) devices emitting different colors on the same wafer, which facilitates their integration with close packing density (not requiring transfer of devices from two different wafers to a third substrate module). The LED devices and driving methods allow light of different colors and similar luminance levels to be emitted for given input current.

11 Claims, 7 Drawing Sheets

(56) References Cited

U.S. PATENT DOCUMENTS

| | | |
|---|---|---|
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,859,330 B2 | 1/2018 | Von Malm et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,721,802 B2 | 7/2020 | Petluri et al. |
| 10,779,371 B2 | 9/2020 | Petluri et al. |
| 2002/0139987 A1 | 10/2002 | Collins, III et al. |
| 2007/0206130 A1 | 9/2007 | Wuu et al. |
| 2008/0099787 A1 | 5/2008 | Coolbaugh et al. |
| 2008/0105954 A1* | 5/2008 | Kodama ............. H01L 29/7813 257/E29.136 |
| 2008/0173884 A1 | 7/2008 | Chitnis et al. |
| 2008/0179602 A1 | 7/2008 | Negley et al. |
| 2010/0078656 A1 | 4/2010 | Seo et al. |
| 2011/0151607 A1 | 6/2011 | Landis et al. |
| 2011/0287606 A1 | 11/2011 | Brun et al. |
| 2012/0050694 A1 | 3/2012 | Huang et al. |
| 2012/0091481 A1 | 4/2012 | Sekine et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2013/0256708 A1 | 10/2013 | Jin et al. |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2016/0336483 A1 | 11/2016 | Shatalov et al. |
| 2016/0372514 A1 | 12/2016 | Chang et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0288088 A1 | 10/2017 | Cheol |
| 2017/0293065 A1 | 10/2017 | Kim |
| 2017/0294418 A1 | 10/2017 | Edmond et al. |
| 2017/0309794 A1 | 10/2017 | Von Malm |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2020/0058824 A1 | 2/2020 | Jang et al. |
| 2020/0314976 A1 | 10/2020 | Soer et al. |
| 2021/0288212 A1* | 9/2021 | Young .................. H01L 33/005 |
| 2021/0288222 A1* | 9/2021 | Young .................. H01L 33/405 |
| 2021/0288223 A1* | 9/2021 | Young .................. H01L 33/32 |
| 2022/0173276 A1* | 6/2022 | Teo ........ H01L 33/385 |
| 2022/0285425 A1* | 9/2022 | Young .................. H01L 33/44 |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20110132162 A | 12/2011 |
| KR | 20140118466 A | 10/2014 |
| KR | 20170018687 A | 2/2017 |
| KR | 20180010670 A | 1/2018 |
| KR | 20180114413 A | 10/2018 |
| KR | 20190067334 A | 6/2019 |
| TW | 201417339 A | 5/2014 |
| TW | 201620163 A | 6/2016 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017089676 A1 | 6/2017 |
| WO | 2017102708 A1 | 6/2017 |
| WO | 2017184686 A | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |

(56) References Cited

FOREIGN PATENT DOCUMENTS

| WO | 2018159977 A1 | 9/2018 |
| WO | 2018169243 A1 | 9/2018 |
| WO | 2019126539 A | 6/2019 |

* cited by examiner

LIGHT EMITTING DIODE DEVICE WITH TUNABLE EMISSION

CROSS-REFERENCE TO RELATED APPLICATIONS

This application claims priority to U.S. Provisional Application No. 63/107,111, filed Oct. 29, 2020, the entire disclosure of which is hereby incorporated by reference herein.

TECHNICAL FIELD

Embodiments of the disclosure generally relate to arrays of light emitting diode (LED) devices and methods of manufacturing the same. More particularly, embodiments are directed to light emitting diode devices that emit a long wavelength light and a short wavelength light.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

The projection of light requires a module with many small LEDs packed closely together. In some applications, it is desirable to place LEDs of different colors closely together in the same module, or even to have one LED emit different colors. This capability could, for example, allow brake indicator (red) and turn indicator (amber) functionality to be integrated into one compact module, taking up less space in an automobile. In the future, there may be a desire for vehicles to project light of different colors onto the road or sidewalk to communicate with pedestrians or other vehicles.

Compact integration of LEDs based on standard AlInGaP red and amber emitters is difficult because different wafers must be used for each color, and the response of LED efficiency to changes in temperature is very different for the different colors. Additionally, using a standard InGaN LED and changing the drive current results in amber light (high current density) of much higher luminance than red light (low current density). Many applications require red light of similar luminance as amber light. For example, both the brake and turn signals of an automobile have to be bright enough to be visible in sunshine. Accordingly, there is a need for LEDs that are able to produce different colors of light but with similar luminance levels.

SUMMARY

Embodiments of the disclosure are directed to LED devices and methods for manufacturing LED devices. In a first embodiment, a light emitting diode (LED) device comprises a mesa comprising semiconductor layers, the semiconductor layers including an n-type layer, an active layer, and a p-type layer; an anode contact comprising a first anode region and a second anode region separated by a gap, the first anode region on a top surface of the mesa, the second anode region adjacent the first anode region; a switch connecting the first anode region and the second anode region; and a cathode contact adjacent the anode contact and in electrical communication with the n-type layer.

In a second embodiment, the first embodiment is modified so that the first anode region has a first area and the second anode region has a second area, the second area larger than the first area. In a third embodiment, the first embodiment is modified so that gap has a width greater than about 1 micron. In a fourth embodiment, the third embodiment further includes a feature that there is a first dielectric layer in the gap. In a fifth embodiment, the fourth embodiment further includes a feature that there is a second dielectric layer on a top surface of the anode contact, and a mirror layer on a top surface of the first dielectric layer. In a sixth embodiment, the fifth embodiment is modified so that the first dielectric layer and the second dielectric layer independently comprise one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$). In a seventh embodiment, the fifth embodiment further includes a feature that the mirror layer comprises one or more of aluminum (Al), silver (Ag), gold (Au), copper (Cu), metallic nitrides and alloys thereof.

In an eighth embodiment, the first embodiment is modified so that the first anode region and the second anode region independently comprise a material selected from one or more of silver (Ag), indium tin oxide (ITO), nickel (Ni), palladium (Pd), platinum (Pt), and zinc oxide (ZnO). In a ninth embodiment, the first embodiment further includes the feature of an anode terminal on the anode contact, a cathode terminal on the cathode contact, and a switch terminal on the switch.

Another aspect of the disclosure pertains to a method of operating the LED device of the first embodiment. In a tenth embodiment, the method comprises opening the switch and flowing a current through the anode contact to the first anode region to emit light having a centroid wavelength less than 590 nm. In an eleventh embodiment, the method comprises closing the switch, and flowing a current through the anode contact to the first anode region and to the second anode region to emit light having a centroid wavelength greater than 610 nm.

Another aspect of the disclosure pertains to a light emitting diode (LED) device. In a twelfth embodiment, a light emitting diode (LED) device comprises a mesa array comprising a first mesa and a second mesa separated by a trench, the first mesa and the second mesa comprising semiconductor layers, the semiconductor layers including an n-type layer, an active layer, and a p-type layer, the trench having at least one side wall and extending to the n-type layer, the first mesa having a first width and the second mesa having a second width, the first width greater than the second width. A first anode contact is on a top surface of the first mesa. A second anode contact is on a top surface of the second mesa, and a cathode contact is adjacent the first mesa and adjacent the second mesa. In a thirteenth embodiment, the twelfth embodied is modified so that the first anode contact and the second anode contact independently comprise a material selected from one or more of silver (Ag), indium tin oxide (ITO), nickel (Ni), palladium (Pd), platinum (Pt), and zinc oxide (ZnO). In a fourteenth embodiment, the twelfth embodiment further includes the feature of a first anode terminal on the first anode contact, a second anode terminal on the second anode contact, and a cathode terminal on the cathode contact. In a fifteenth embodiment, the twelfth embodiment further includes the feature of a dielectric layer on the at least one sidewall of the trench. In a sixteenth embodiment, the fifteenth embodiment is modified so that the dielectric layer comprises one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

Another aspect of the disclosure pertains to a method of operating the LED device of the twelfth embodiment. In a seventeenth embodiment, the method comprises flowing a current through the first anode contact to emit light having a centroid wavelength less than 590 nm. In an eighteenth embodiment, the method comprises flowing a current through the second anode contact to emit light having a centroid wavelength greater than 610 nm.

A further aspect of the disclosure pertains to a light emitting diode (LED) device. In a nineteenth embodiment, a light emitting diode (LED) device comprises a first mesa array comprising a plurality of first mesas separated by a first trench, the first trench filled with a dielectric layer; a second mesa array comprising a plurality of second mesas separated by a second trench, the second trench filled with a dielectric layer; a first anode contact on a top surface of the first mesa array; a second anode contact on a top surface of the second mesa array; and a cathode contact adjacent to the first mesa array and the second mesa array. The plurality of first mesas and the plurality of second mesas comprise semiconductor layers. The semiconductor layers include an n-type layer, an active layer, and a p-type layer, and the first trench and the second trench extend to the n-type layer. In a twentieth embodiment, the nineteenth embodiment is modified so that the first anode contact and the second anode contact independently comprise a material selected from one or more of silver (Ag), indium tin oxide (ITO), nickel (Ni), palladium (Pd), platinum (Pt), and zinc oxide (ZnO). In a twenty-first embodiment, further includes the feature of a first anode terminal on the first anode contact, a second anode terminal on the second anode contact, and a cathode terminal on the cathode contact. In a twenty-second embodiment, the nineteenth embodiment is modified so that the dielectric layer comprises one or more of silicon oxide ($SiO_2$), aluminum oxide ($Al_2O_3$), silicon nitride ($SiN_x$), titanium oxide ($TiO_2$), niobium oxide ($Nb_2O_5$), zirconium oxide ($ZrO_2$), and hafnium oxide ($HfO_2$).

Another aspect of the disclosure pertains to a method of operating the LED device of the nineteenth embodiment. In a twenty-third embodiment, the method comprises flowing a current through the first anode contact to emit light having a centroid wavelength less than 590 nm. In twenty-fourth embodiment, the method comprises flowing a current through the second anode contact to emit light having a centroid wavelength greater than 610 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
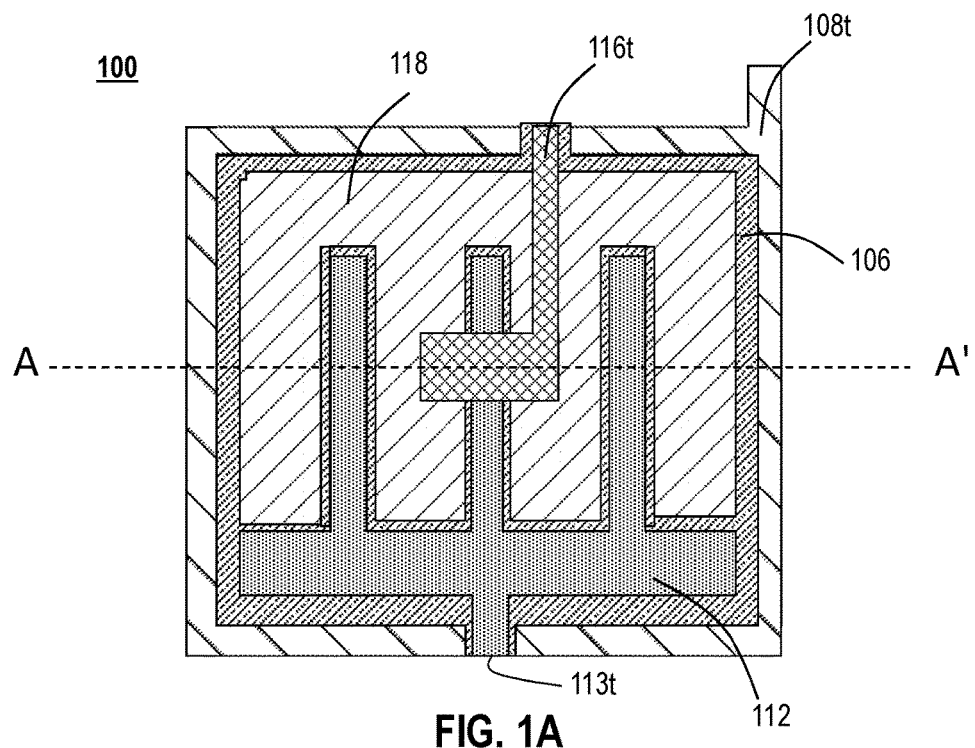
FIG. 1A illustrates a top view of an LED device according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AN, InN and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe LED devices and methods for forming LED devices. In particular, the present disclosure describes LED devices and methods to produce LED devices which advantageously emit multiple colors or wavelengths from a single wafer. The LED devices allow light of similar luminance levels to be emitted for different driving current densities. One or more embodiments of the disclosure can be used in the fabrication of microLED displays.

In one or embodiments, provided is a gallium nitride (GaN)-based LED wafer containing InGaN quantum wells, which emits light having a centroid wavelength greater than 610 nm for a sufficiently low current density and emits light having a centroid wavelength less than 590 nm for larger current densities.

In one or more embodiments, a pulsed current source is used to drive the LED. In one or more embodiments, the duty cycle of the current source is controlled in addition to the current. In one or more embodiments, light having a centroid wavelength less than 590 nm of similar time-averaged radiance as light having a centroid wavelength greater than 610 nm is obtained by increasing the current while decreasing the duty cycle. In one or more embodiments, pulse frequency is set high enough so that intensity modulation from individual pulses is not visible.

In one or more embodiments, a pulsed voltage source is used to drive the LED. In one or more embodiments, the duty cycle of the voltage source is controlled in addition to the voltage. In one or more embodiments, light having a centroid wavelength less than 590 nm of similar time-averaged radiance as light having a centroid wavelength greater than 610 nm is obtained by increasing the voltage while decreasing the duty cycle. In one or more embodiments, pulse frequency is set high enough so that intensity modulation from individual pulses is not visible.

In one or more embodiments, the LED includes an integrated switch that increases the anode contact area when the LED is operated in an emitting mode where the centroid wavelength greater than 610 nm. In one or more embodiments, the increase in contact area is designed to shift the color from light having a centroid wavelength less than 590 nm to light having a centroid wavelength greater than 610 nm when the LED is operated at fixed dc current.

In one or more embodiments, the LED wafer is divided into two arrays of pixels with equal numbers of pixels of different sizes in each array. Two separate anode contacts are provided (one for each array). The array with larger pixel size emits light having a centroid wavelength greater than 610 nm, and the array with smaller pixel size emits light having a centroid wavelength less than 590 nm. In one or more embodiments, the two arrays can be driven with the same current supply or different current supplies. In some embodiments, the two arrays can be driven by a fixed DC current supply.

In one or more embodiments, the LED wafer is divided into two arrays of pixels with different numbers of pixels of equal sizes in each array. Two separate anode contacts are provided (one for each array). In one or more embodiments, the array with more pixels emits light having a centroid wavelength greater than 610 nm. In one or more embodiments, the array with fewer pixels emits light having a centroid wavelength less than 590 nm. The two arrays can be driven with the same current supply or different ones. The array with more pixels emits light having a centroid wavelength greater than 610 nm, and the array with fewer pixels emits light having a centroid wavelength less than 590 nm. In one or more embodiments, the two arrays can be driven with the same current supply or different current supplies. In some embodiments, the two arrays can be driven by a fixed DC current supply.

Figure 1B:
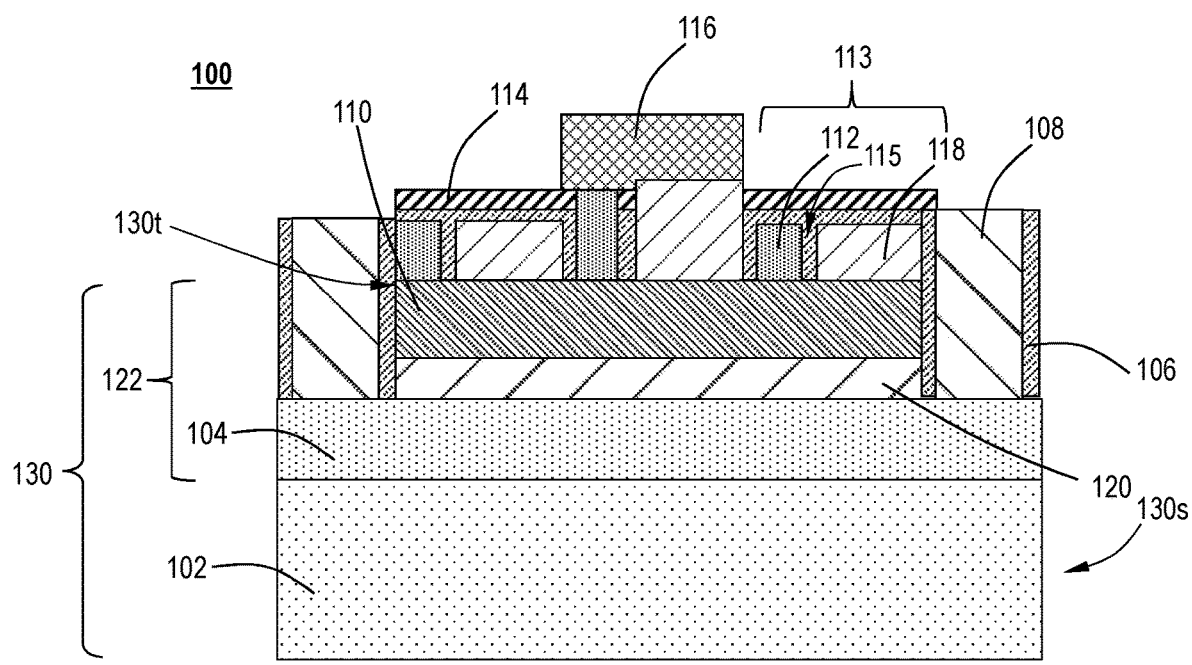
FIG. 1B illustrates a cross-sectional view of the LED device of FIG. 1A.

FIG. 1A illustrates a top view of an LED device according to one or more embodiments. FIG. 1B illustrates a cross-sectional view taken alone line A-A' of the LED device of FIG. 1A. Referring to FIGS. 1A and 1B, in one or more embodiments semiconductor layers 122 are grown on a substrate 102. The semiconductor layers 122 according to one or more embodiments comprise epitaxial layers, III-nitride layers or epitaxial III-nitride layers. In one or more embodiments, the semiconductor layers are epitaxial semiconductor layers having a thickness at least 1 micron.

The substrate 102 may be any substrate known to one of skill in the art. In one or more embodiments, the substrate 102 comprises one or more of sapphire, silicon carbide, silicon (Si), quartz, magnesium oxide (MgO), zinc oxide (ZnO), spinel, and the like. In one or more embodiments, the substrate 102 is not patterned prior to the growth of the Epi-layer. Thus, in some embodiments, the substrate 102 is not patterned and can be considered to be flat or substantially flat. In other embodiments, the substrate is patterned, e.g. patterned sapphire substrate (PSS).

In one or more embodiments, the semiconductor layers 122 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 122 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 122 comprise a p-type layer 110, an active region 120, and an n-type layer 104. In specific embodiments, the n-type layer 104 and p-type layer 110 of the LED comprise n-doped and p-doped GaN.

In one or more embodiments, the layers of III-nitride material which form the LED are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). In other embodiments, the substrate is placed in a metalorganic vapor-phase epitaxy (MOVPE) reactor for epitaxy of LED device layers to grow the semiconductor layers 122.

"Sputter deposition" as used herein refers to a physical vapor deposition (PVD) method of thin film deposition by sputtering. In sputter deposition, a material, e.g. a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step maybe conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, the semiconductor layers 122 comprise a stack of undoped III-nitride material and doped III-nitride material. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In specific embodiments, the semiconductor layers 122 comprise an n-type layer 104, an active layer 120 and a p-type layer 110.

In one or more embodiments, the semiconductor layers 122 have a combined thickness in a range of from about 1 µm to about 10 µm, including a range of from about 1 µm to about 9 µm, 1 µm to about 8 µm, 1 µm to about 7 µm, 1 µm to about 6 µm, 1 µm to about 5 µm, 1 µm to about 4 µm, 1 µm to about 3 µm, 2 µm to about 10 µm, including a range of from about 2 µm to about 9 µm, 2 µm to about 8 µm, 2 µm to about 7 µm, 2 µm to about 6 µm, 2 µm to about 5 µm, 2 µm to about 4 µm, 2 µm to about 3 µm, 3 µm to about 10 µm, 3 µm to about 9 µm, 3 µm to about 8 µm, 3 µm to about 7 µm, 3 µm to about 6 µm, 3 µm to about 5 µm, 3 µm to about 4 µm, 4 µm to about 10 µm, 4 µm to about 9 µm, 4 µm to about 8 µm, 4 µm to about 7 µm, 4 µm to about 6 µm, 4 µm to about 5 µm, 5 µm to about 10 µm, 5 µm to about 9 µm, 5 µm to about 8 µm, 5 µm to about 7 µm, 5 µm to about 6 µm, 6 µm to about 10 µm, 6 µm to about 9 µm, 6 µm to about 8 µm, 6 µm to about 7 µm, 7 µm to about 10 µm, 7 µm to about 9 µm, or 7 µm to about 8 µm.

In one or more embodiments, an active region 120 is formed between the n-type layer 104 and the p-type layer 110. The active region 120 may comprise any appropriate materials known to one of skill in the art. In one or more embodiments, the active region 120 is comprised of a III-nitride material multiple quantum wells (MQW), and a III-nitride electron blocking layer.

In one or more embodiments, the quantum well design in the epitaxy is changed to intentionally increase the peak shift with current. In some embodiments, the physical width of the quantum well is made wider. Accordingly, in one or more embodiments, the width of the quantum wells is in a range of from about 2 nm to about 7 nm.

In some embodiments, the semiconductor layers 122 and the substrate 102 are etched to form a mesa 130. In the embodiment illustrated in FIG. 1B, the mesa 130 has a top surface 130t and at least one side wall 130s.

In one or more embodiments, the light emitting diode (LED) device 100 includes an anode contact 113 and a cathode contact 108. In one or more embodiments, the anode contact 113 is divided into two regions, a first anode region 112 and a second anode region 118. The first anode region 112 and the second anode region 118 are of unequal size. Typically, the first anode region and the second anode region are separated from one another by a gap 115. Accordingly, in one or more embodiments, the anode contact 113 has a first anode region 112 and a second anode region 118 separated by a gap 115. The first anode region 112 is on a top surface 130t of the mesa 130. The second anode region 118 is adjacent to the first anode region 112.

In one or more embodiments, the first anode region 112 and the second anode region 118 are shorted together using a switch 116. In one or more embodiments, the switch 116 is an electronic switch. The switch 116 connects the first anode region and the second anode region 118.

The area ratio of the first anode region 112 to the sum of the area of both the first anode region 112 and the second anode region 118 is chosen such that, for a given input current, light emission having a centroid wavelength less than 590 nm is obtained when current is injected only to the first anode region 112. In one or more embodiments, light emission having a centroid wavelength greater than 610 nm is obtained when current is injected to both the first anode region 112 and the second anode region 118. In other words, the current density is changed by switching the anode area rather than by changing the current. Without intending to be bound by theory, it is thought that this approach allows current density (and color) to be changed without large changes in luminance.

In one or more embodiments, the gap 115 between the first anode region 112 and the second anode region 118 is filled with a dielectric layer 106 so that current flows through only the first anode region 112 when the switch 116 is open. In one or more embodiments, the gap 115 is has a width that is greater than 5 microns so that lateral current spreading from the first anode region 112 and the second anode region 118 through the p-type layer 110 with the switch 116 open is negligible. Optionally, for an LED that emits light from the side of the growth substrate 102, a separate mirror layer 114 can be disposed on top of the anode contact 113 to prevent light from escaping through the gap 115 between the first anode region 112 and the second anode region 118. An additional dielectric layer 106 may prevent shorting of the mirror 114 to the anode contact 113.

In one or more embodiments, the anode contact 113 comprises a reflective material or a transparent conductor. In one or more embodiments, the anode contact 113 comprises one or more one or more of silver (Ag), indium tin oxide (ITO), nickel (Ni), palladium (Pd), platinum (Pt), and zinc oxide (ZnO). In one or more embodiments, the first anode region and the second anode region independently comprise a material selected from one or more of silver (Ag), indium tin oxide (ITO), nickel (Ni), palladium (Pd), platinum (Pt), and zinc oxide (ZnO).

As used herein, the term "dielectric" refers to an electrical insulator material that can be polarized by an applied electric field. In one or more embodiments, the dielectric layer 106 includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer 106 comprises silicon nitride ($Si_3N_4$). In one or more embodiments, the dielectric layer 106 comprises silicon oxide ($SiO_2$). In some embodiments, the dielectric layer 106 composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxycarbides (e.g. silicon oxycarbide (SiOC)), and oxynitrocarbides (e.g. silicon oxycarbonitride (SiNCO)). In one or more embodiments, the dielectric layer 106 comprises one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

In one or more embodiments, the dielectric layer 106 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the cathode contact 108 is adjacent to the anode contact 113 and in electrical communication with the n-type layer 104.

In one or more embodiments, the cathode contact 108 comprises a metal selected from the group consisting of titanium (Ti), aluminum (Al), chromium (Cr), silver (Ag), gold (Ag), and alloys or multilayers thereof.

With reference to FIG. 1A, an electrical terminal 116*t* for operation of the switch 116 is required, in addition to the usual cathode contact terminal 108*t* and anode contact 113 terminal 113*t* of an LED.

Figure 2A:
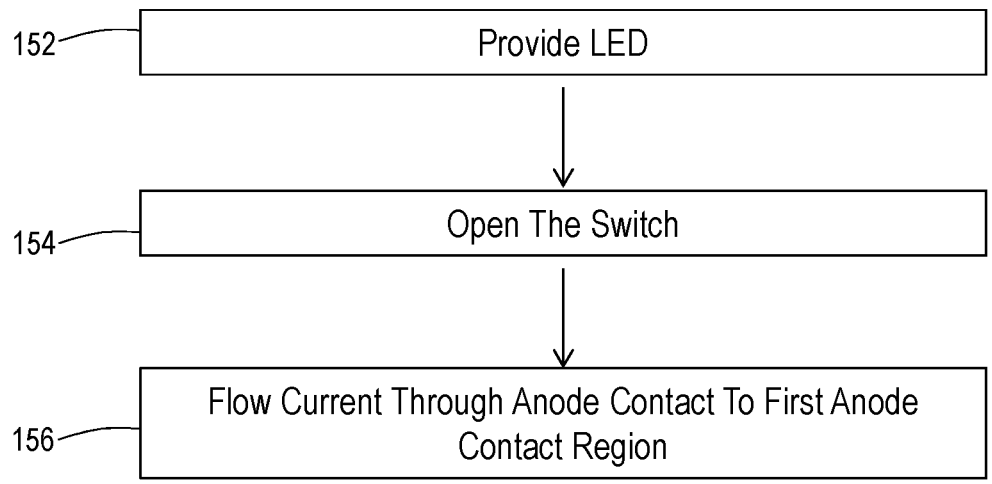
FIG. 2A illustrates a process flow diagram of a method according to one or more embodiments.

FIG. 2A illustrates a process flow diagram of a method 150 according to one or more embodiments. In one or more embodiments, the method 150 of operating the LED of FIGS. 1A and 1B requires, at operation 152, an LED is provided for processing. As used in this specification and the appended claims, the term "provided" means that the LED is made available for operation. In some embodiments, the LED has already been fabricated. In other embodiments, the LED is fabricated according to one or more embodiments described herein. At operation 154, the switch 116 is opened and, at operation 156, a current is flowed through the anode contact 113 to the first anode contact region 112 to emit light having a centroid wavelength less than 590 nm.

Figure 2B:
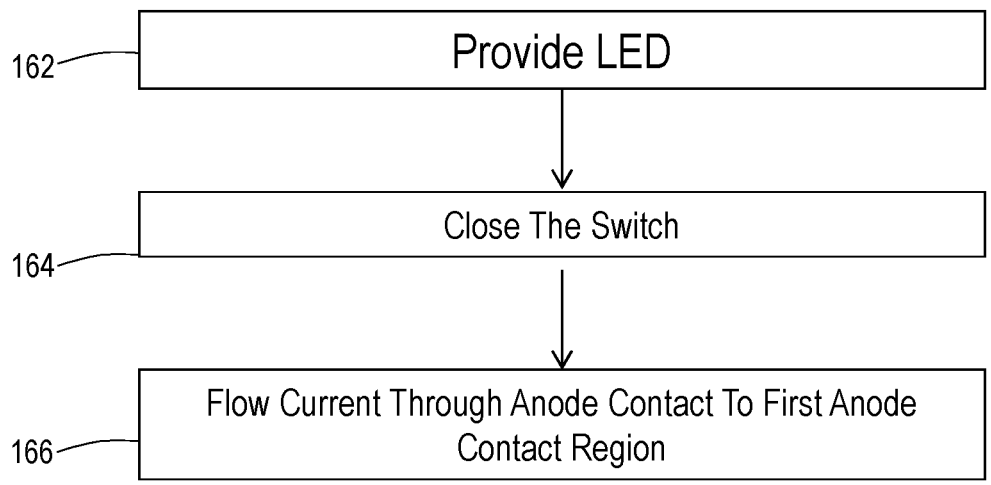
FIG. 2B a process flow diagram of a method according to one or more embodiments.

FIG. 2B illustrates a process flow diagram of a method 160 according to one or more embodiments. In one or more embodiments, the method 160 of operating the LED of FIGS. 1A and 1B requires, at operation 162, an LED is provided for processing. At operation 164, closing the switch 116 is closed and, at operation 166, a current is flowed through the anode contact 113 to the first anode contact region 112 to emit light having a centroid wavelength greater than 610 nm.

Figure 3A:
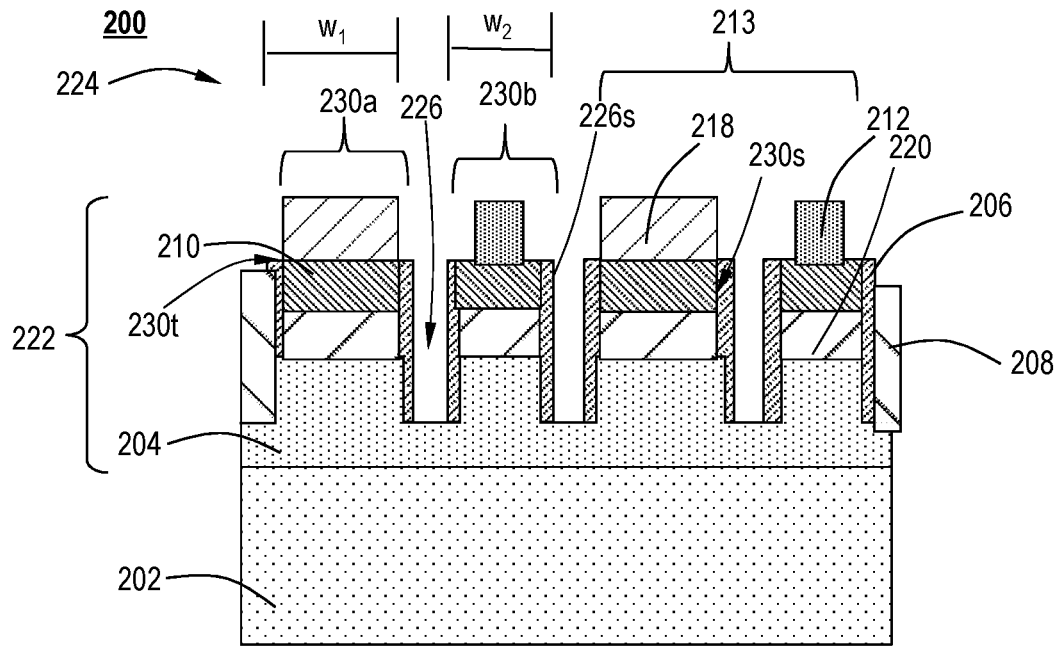
FIG. 3A illustrates a cross-sectional view of an LED device according to one or more embodiments.
Figure 3B:
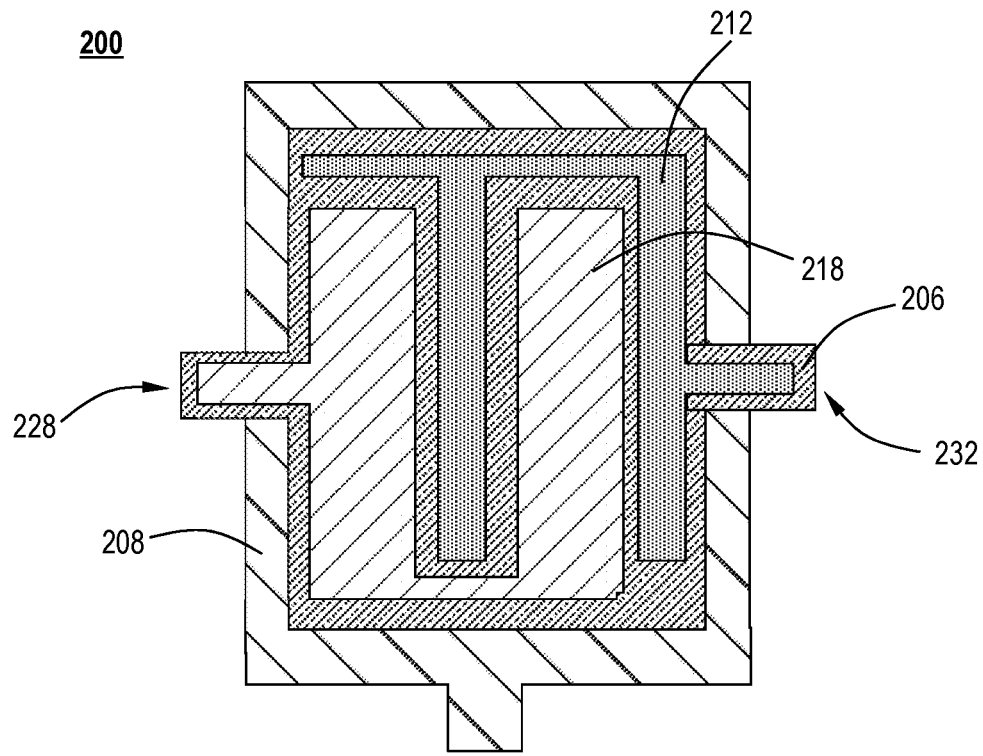
FIG. 3B illustrates a top view of the LED device of FIG. 3A.

FIG. 3A illustrates a cross-sectional view of an LED device according to one or more embodiments. FIG. 3B illustrates a top view of the LED device of FIG. 3A. Referring to FIGS. 3A and 3B, in one or more embodiments semiconductor layers 222 are grown on a substrate 202. The semiconductor layers 222 according to one or more embodiments comprise epitaxial layers, III-nitride layers or epitaxial III-nitride layers. In one or more embodiments, the semiconductor layers are epitaxial semiconductor layers having a thickness at least 1 micron.

The substrate 202 may be any substrate known to one of skill in the art. In one or more embodiments, the substrate 202 comprises one or more of sapphire, silicon carbide, silicon (Si), quartz, magnesium oxide (MgO), zinc oxide (ZnO), spinel, and the like. In one or more embodiments, the substrate 202 is not patterned prior to the growth of the Epi-layer. Thus, in some embodiments, the substrate 202 is not patterned and can be considered to be flat or substantially flat. In other embodiments, the substrate 202 is patterned, e.g. patterned sapphire substrate (PSS).

In one or more embodiments, the semiconductor layers 222 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 222 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 222 comprise a p-type layer 210, an active region 220, and an n-type layer 204. In specific embodiments, the n-type layer 204 and p-type layer 210 of the LED comprise n-doped and p-doped GaN.

In one or more embodiments, the layers of III-nitride material which form the LED are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). In other embodiments, the substrate is placed in a metalorganic vapor-phase epitaxy (MOVPE) reactor for epitaxy of LED device layers to grow the semiconductor layers 222.

In one or more embodiments, the semiconductor layers 222 comprise a stack of undoped III-nitride material and doped III-nitride material. The III-nitride materials may be doped with one or more of silicon (Si), oxygen (O), germanium (Ge), tin (Sn), zinc (Zn), beryllium (Be), carbon (C), or magnesium (Mg) depending upon whether p-type or n-type III-nitride material is needed. In specific embodiments, the semiconductor layers 222 comprise an n-type layer 204, an active layer 220 and a p-type layer 210.

In one or more embodiments, the semiconductor layers 222 have a combined thickness in a range of from about 1 μm to about 10 μm, including a range of from about 1 μm to about 9 μm, 1 μm to about 8 μm, 1 μm to about 7 μm, 1 μm to about 6 μm, 1 μm to about 5 μm, 1 μm to about 4 μm, 1 μm to about 3 μm, 2 μm to about 10 μm, including a range of from about 2 μm to about 9 μm, 2 μm to about 8 μm, 2 μm to about 7 μm, 2 μm to about 6 μm, 2 μm to about 5 μm, 2 μm to about 4 μm, 2 μm to about 3 μm, 3 μm to about 10 μm, 3 μm to about 9 μm, 3 μm to about 8 μm, 3 μm to about 7 μm, 3 μm to about 6 μm, 3 μm to about 5 μm, 3 μm to about 4 µm, 4 µm to about 10 µm, 4 µm to about 9 µm, 4 µm to about 8 µm, 4 µm to about 7 µm, 4 µm to about 6 µm, 4 µm to about 5 µm, 5 µm to about 10 µm, 5 µm to about 9 µm, 5 µm to about 8 µm, 5 µm to about 7 µm, 5 µm to about 6 µm, 6 µm to about 10 µm, 6 µm to about 9 µm, 6 µm to about 8 µm, 6 µm to about 7 µm, 7 µm to about 10 µm, 7 µm to about 9 µm, or 7 µm to about 8 µm.

In one or more embodiments, an active region 220 is formed between the n-type layer 204 and the p-type layer 210. The active region 220 may comprise any appropriate materials known to one of skill in the art. In one or more embodiments, the active region 220 is comprised of a III-nitride material multiple quantum wells (MQW), and a III-nitride electron blocking layer.

In some embodiments, the semiconductor layers 222 and the substrate 202 are etched to form arrays of mesas 230a, 230b. In the embodiment illustrated in FIG. 3B, the mesas 230a, 23b have a top surface 230t and at least one side wall 230s. The mesa array includes a first mesa 230a and a second mesa 230b separated by a trench 226. The first mesa 230a and the second mesa 230b include semiconductor layers 222. In one or more embodiments, the trench 226 has at least one side wall 226s. The trench 226 extends to the n-type layer 204. In one or more embodiments, the first mesa 230a has a first width, $w_1$, and the second mesa 230b has a second width, $w_2$. In one or more embodiments, the first width, $w_1$, is greater than the second width, $w_2$.

In one or more embodiments, the light emitting diode (LED) device 200 includes an anode contact 213 and a cathode contact 208. In one or more embodiments, the anode contact 213 is divided into two regions, a first anode region 218 and a second anode region 212. The first anode region 218 and the second anode region 212 are of unequal size. The first anode region 218 is on a top surface 230t of the first mesa 230a. The second anode region 212 is on a top surface 230t of the second mesa 230b.

In one or more embodiments, the size of the mesa 230b is smaller in the array that emits light having a centroid wavelength less than 590 nm than it is in the array that emits light having a centroid wavelength greater than 610 nm. In one or more embodiments, each array has its own anode region 218, 218, which may be connected to its own separate current driver, or to one current driver that is switched between the two anodes using circuitry external to the LED. Thus, for the same driving current, the array with smaller mesas 230b emits light having a centroid wavelength less than 590 nm, while the array with larger mesas 230a emits light having a centroid wavelength greater than 610 nm of similar luminance level. In one or more embodiments, the required ratio of small to large areas of the mesas can be found by spectrum vs. current density measurements of an LED with standard anode contact built from the same type of epitaxial wafer.

In one or more embodiments a dielectric layer 206 is on the at least one side wall 226s of the trench 226. In one or more embodiments, the dielectric layer 206 includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer 206 comprises silicon nitride ($Si_3N_4$). In one or more embodiments, the dielectric layer 206 comprises silicon oxide ($SiO_2$). In some embodiments, the dielectric layer 206 composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxy-carbides (e.g. silicon oxycarbide (SiOC)), and oxynitrocarbides (e.g. silicon oxycarbonitride (SiNCO)). In one or more embodiments, the dielectric layer 206 comprises one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

In one or more embodiments, the anode contact 213 comprises a reflective material or a transparent conductor. In one or more embodiments, the anode contact 213 comprises one or more one or more of silver (Ag), indium tin oxide (ITO), nickel (Ni), palladium (Pd), platinum (Pt), and zinc oxide (ZnO). In one or more embodiments, the first anode region 218 and the second anode region 212 independently comprise a material selected from one or more of silver (Ag), indium tin oxide (ITO), nickel (Ni), palladium (Pd), platinum (Pt), and zinc oxide (ZnO).

In one or more embodiments, the cathode contact 208 is adjacent to the anode contact 213 and in electrical communication with the n-type layer 204.

In one or more embodiments, the cathode contact 208 comprises a metal selected from the group consisting of comprises a metal selected from the group consisting of titanium (Ti), aluminum (Al), chromium (Cr), silver (Ag), gold (Ag), and alloys or multilayers thereof.

With reference to FIG. 3B, an electrical terminal 232 for the array that emits light having a centroid wavelength less than 590 nm and an electrical terminal 228 for the array that emits light having a centroid wavelength greater than 610 nm are necessary. In addition, a cathode contact terminal 230 is present.

Figure 4A:
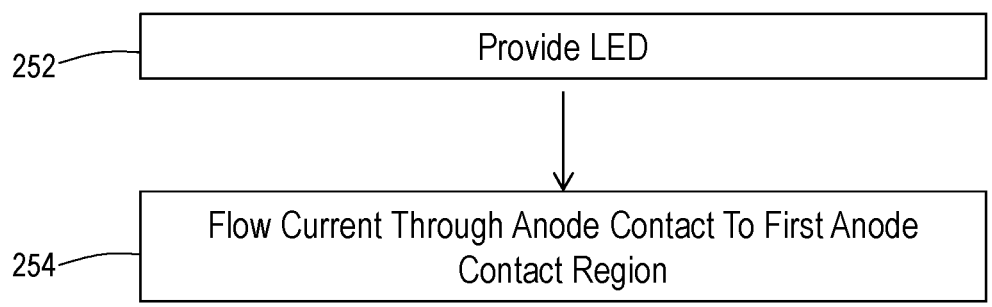
FIG. 4A illustrates a process flow diagram of a method according to one or more embodiments.

FIG. 4A illustrates a process flow diagram of a method 250 according to one or more embodiments. In one or more embodiments, the method 250 of operating the LED of FIG. 4A, at operation 252, an LED is provided for processing. As used in this specification and the appended claims, the term "provided" means that the LED is made available for operation. In some embodiments, the LED has already been fabricated. In other embodiments, the LED is fabricated according to one or more embodiments described herein. At operation 254, a current is flowed through the anode contact 213 to the first anode contact region 218 to emit light having a centroid wavelength less than 590 nm.

Figure 4B:
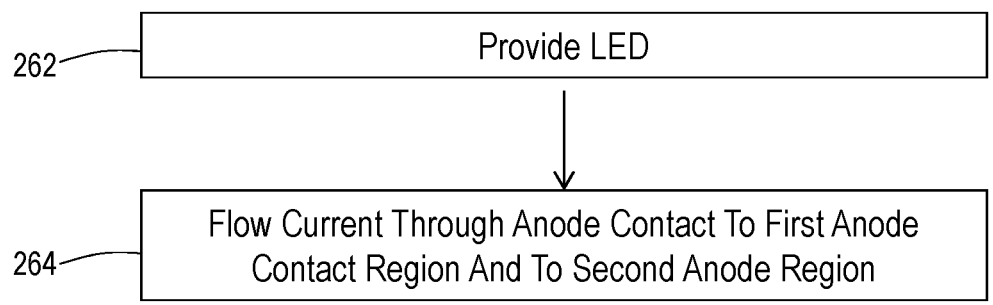
FIG. 4B a process flow diagram of a method according to one or more embodiments.

FIG. 4B illustrates a process flow diagram of a method 260 according to one or more embodiments. In one or more embodiments, the method 260 of operating the LED of FIG. 4B requires, at operation 262, an LED is provided for processing. At operation 264, a current is flowed through the anode contact 1213 to the first anode contact region 218 and to the second anode contact region 212 to emit light having a centroid wavelength greater than 610 nm.

Figure 5A:
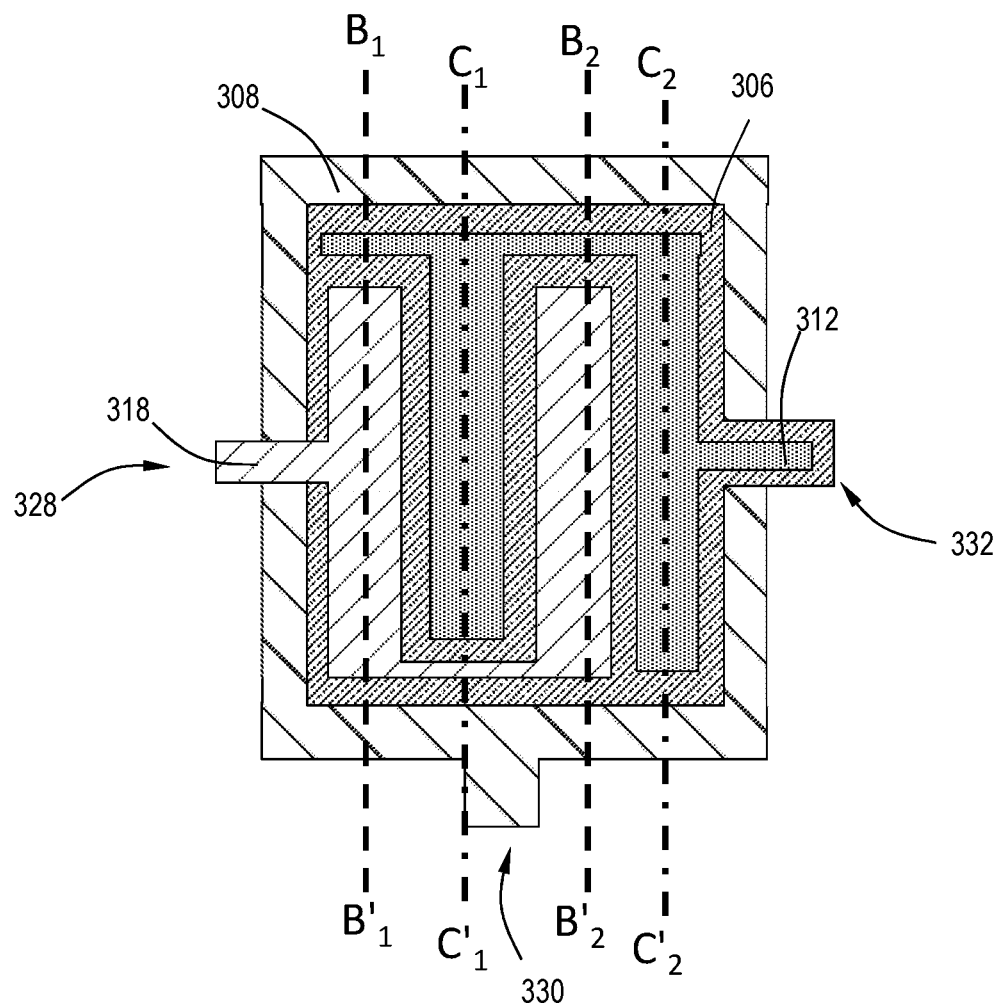
FIG. 5A illustrates a cross-sectional view of an LED device according to one or more embodiments.
Figure 5B:
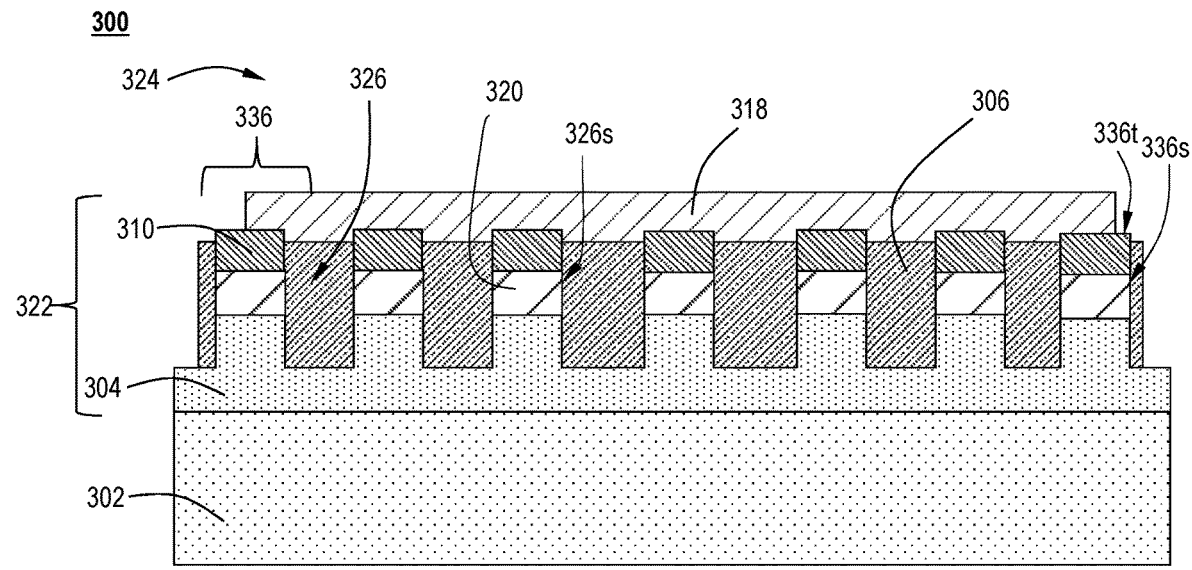
FIG. 5B illustrates a cross-sectional view of an LED device according to one or more embodiments.
Figure 5C:
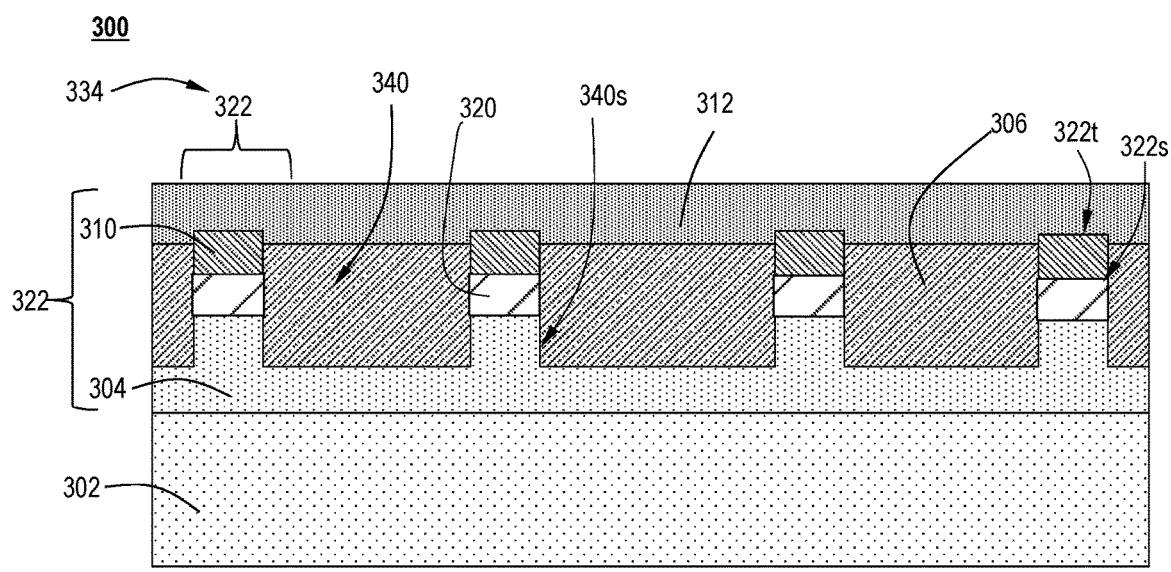
FIG. 5C illustrates a top view of the LED device of FIGS. 5A and 5B.

FIG. 5A illustrates a top view of an LED device according to one or more embodiments. FIG. 5B illustrates a cross-sectional view taken along lines $B_1$-$B'_1$ and $B_2$-$B'_2$ of the LED device of FIG. 5A. FIG. 5C illustrates a cross-sectional view taken along lines $C_1$-$C'_1$ and $C_2$-$C'_2$ of the LED device of FIG. 5A. Referring to FIGS. 5A-5C, in one or more embodiments semiconductor layers 322 are grown on a substrate 302. The semiconductor layers 322 according to one or more embodiments comprise epitaxial layers, III-nitride layers or epitaxial III-nitride layers. In one or more embodiments, the semiconductor layers are epitaxial semiconductor layers having a thickness at least 1 micron.

The substrate 302 may be any substrate known to one of skill in the art. In one or more embodiments, the substrate 302 comprises one or more of sapphire, silicon carbide, silicon (Si), quartz, magnesium oxide (MgO), zinc oxide (ZnO), spinel, and the like. In one or more embodiments, the substrate 302 is not patterned prior to the growth of the Epi-layer. Thus, in some embodiments, the substrate 302 is not patterned and can be considered to be flat or substantially flat. In other embodiments, the substrate 302 is patterned, e.g. patterned sapphire substrate (PSS).

In one or more embodiments, the semiconductor layers 322 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 322 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 322 comprise a p-type layer 310, an active region 320, and an n-type layer 304. In specific embodiments, the n-type layer 304 and p-type layer 310 of the LED comprise n-doped and p-doped GaN.

In one or more embodiments, the layers of III-nitride material which form the LED are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). In other embodiments, the substrate is placed in a metalorganic vapor-phase epitaxy (MOVPE) reactor for epitaxy of LED device layers to grow the semiconductor layers 322.

In one or more embodiments, the semiconductor layers 322 comprise a stack of undoped III-nitride material and doped III-nitride material. The III-nitride materials may be doped with one or more of silicon (Si), oxygen (O), germanium (Ge), tin (Sn), zinc (Zn), beryllium (Be), carbon (C), or magnesium (Mg) depending upon whether p-type or n-type III-nitride material is needed. In specific embodiments, the semiconductor layers 322 comprise an n-type layer 304, an active layer 320 and a p-type layer 310.

In one or more embodiments, the semiconductor layers 322 have a combined thickness in a range of from about 1 µm to about 10 µm, including a range of from about 1 µm to about 9 µm, 1 µm to about 8 µm, 1 µm to about 7 µm, 1 µm to about 6 µm, 1 µm to about 5 µm, 1 µm to about 4 µm, 1 µm to about 3 µm, 2 µm to about 10 µm, including a range of from about 2 µm to about 9 µm, 2 µm to about 8 µm, 2 µm to about 7 µm, 2 µm to about 6 µm, 2 µm to about 5 µm, 2 µm to about 4 µm, 2 µm to about 3 µm, 3 µm to about 10 µm, 3 µm to about 9 µm, 3 µm to about 8 µm, 3 µm to about 7 µm, 3 µm to about 6 µm, 3 µm to about 5 µm, 3 µm to about 4 µm, 4 µm to about 10 µm, 4 µm to about 9 µm, 4 µm to about 8 µm, 4 µm to about 7 µm, 4 µm to about 6 µm, 4 µm to about 5 µm, 5 µm to about 10 µm, 5 µm to about 9 µm, 5 µm to about 8 µm, 5 µm to about 7 µm, 5 µm to about 6 µm, 6 µm to about 10 µm, 6 µm to about 9 µm, 6 µm to about 8 µm, 6 µm to about 7 µm, 7 µm to about 10 µm, 7 µm to about 9 µm, or 7 µm to about 8 µm.

In one or more embodiments, an active region 320 is formed between the n-type layer 304 and the p-type layer 310. The active region 320 may comprise any appropriate materials known to one of skill in the art. In one or more embodiments, the active region 320 is comprised of a III-nitride material multiple quantum wells (MQW), and a III-nitride electron blocking layer.

In some embodiments, the semiconductor layers 322 and the substrate 302 are etched to form arrays 324, 334 of mesas 336, 332. In one or more embodiments, the number of mesas 336, 332 in each array 324, 334 is varied. In one or more embodiments, the array 324 that emits light having a centroid wavelength greater than 610 nm has more mesas 336 than the array 334 that emits light having a centroid wavelength less than 590 nm, which has fewer mesas 322. The required ratio of numbers of mesas 322, 336 in each array 334, 324 can be found by spectrum versus current density measurements of an LED with standard anode contact built from the same type of epitaxial wafer.

In the embodiment illustrated in FIG. 5B the mesas 336 have a top surface 336$t$ and at least one side wall 336$s$. The mesa array 324 includes a plurality of mesas 336 separated by a trench 326. The plurality of mesas 336 include semiconductor layers 322. In one or more embodiments, the trench 326 has at least one side wall 326$s$. The trench 326 extends to the n-type layer 304.

In the embodiment illustrated in FIG. 5C the mesas 322 have a top surface 322$t$ and at least one side wall 322$s$. The mesa array 334 includes a plurality of mesas 322 separated by a trench 340. The plurality of mesas 322 include semiconductor layers 322. In one or more embodiments, the trench 340 has at least one side wall 340$s$. The trench 340 extends to the n-type layer 304.

In one or more embodiments, the light emitting diode (LED) device 300 includes an anode contact is divided into two regions, a first anode region 318 and a second anode region 312. The first anode region 318 is on a top surface 336$t$ of the plurality of mesas 336. The second anode region 3212 is on a top surface 322$t$ of the plurality of mesas 322.

Referring to FIG. 5B, in one or more embodiments a dielectric layer 306 fills the trench 326. Referring to FIG. 5C, in one or more embodiments a dielectric layer 306 fills the trench 340. In one or more embodiments, the dielectric layer 306 includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer 306 comprises silicon nitride ($Si_3N_4$). In one or more embodiments, the dielectric layer 306 comprises silicon oxide ($SiO_2$). In some embodiments, the dielectric layer 306 composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxycarbides (e.g. silicon oxycarbide (SiOC)), and oxynitrocarbides (e.g. silicon oxycarbonitride (SiNCO)). In one or more embodiments, the dielectric layer 306 comprises one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

In one or more embodiments, the anode contact comprises a reflective material or a transparent conductor. In one or more embodiments, the anode contact comprises one or more one or more of silver (Ag), indium tin oxide (ITO), nickel (Ni), palladium (Pd), platinum (Pt), and zinc oxide (ZnO). In one or more embodiments, the first anode region 318 and the second anode region 312 independently comprise a material selected from one or more of silver (Ag), indium tin oxide (ITO), nickel (Ni), palladium (Pd), platinum (Pt), and zinc oxide (ZnO).

Referring to FIG. 5A, in one or more embodiments, the light emitting diode (LED) device 300 includes a cathode contact 308. In one or more embodiments, the cathode contact 308 is adjacent to the mesa array 334 and the mesa array 324 and in electrical communication with the n-type layer 304.

In one or more embodiments, the cathode contact 308 comprises a metal selected from the group consisting of titanium (Ti), aluminum (Al), chromium (Cr), silver (Ag), gold (Ag), and alloys or multilayers thereof.

With reference to FIG. 5A, an electrical terminal 332 for the array that emits light having a centroid wavelength less than 590 nm and an electrical terminal 328 for the array that emits light having a centroid wavelength greater than 610 nm are necessary. In addition, a cathode contact terminal 330 is present.

Figure 6A:
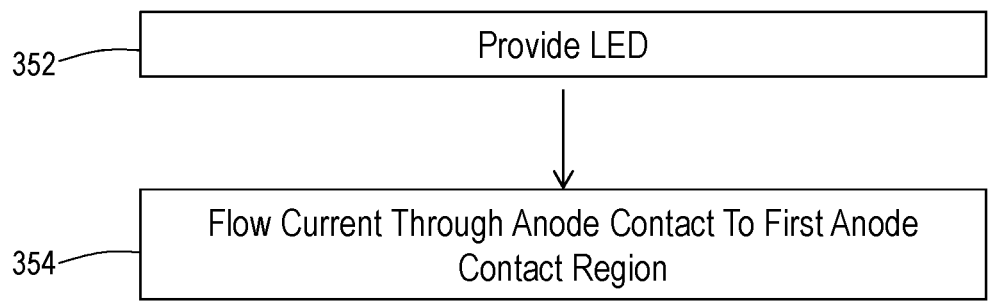
FIG. 6A illustrates a process flow diagram of a method according to one or more embodiments.

FIG. 6A illustrates a process flow diagram of a method 350 according to one or more embodiments. In one or more embodiments, the method 350 of operating the LED of FIG. 6A, at operation 352, an LED is provided for processing. As used in this specification and the appended claims, the term "provided" means that the LED is made available for operation. In some embodiments, the LED has already been fabricated. In other embodiments, the LED is fabricated according to one or more embodiments described herein. At operation 354, through the anode contact 312 to emit light having a centroid wavelength less than 590 nm.

Figure 6B:
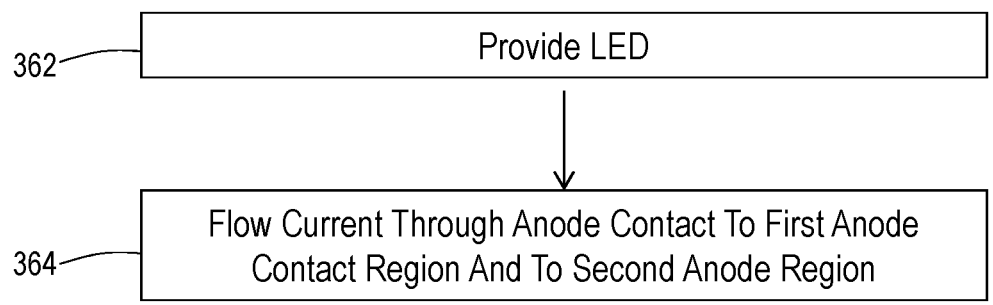
FIG. 6B illustrates a process flow diagram of a method according to one or more embodiments.

FIG. 6B illustrates a process flow diagram of a method 360 according to one or more embodiments. In one or more embodiments, the method 360 of operating the LED of FIG. 6B requires, at operation 362, an LED is provided for processing. At operation 364, a current is flowed through the anode contact 318 to emit light having a centroid wavelength greater than 610 nm.

EMBODIMENTS

Various embodiments are listed below. It will be understood that the embodiments listed below may be combined with all aspects and other embodiments in accordance with the scope of the invention.

Embodiment (a). A light emitting diode (LED) device comprising: a mesa comprising semiconductor layers, the semiconductor layers including an n-type layer, an active layer, and a p-type layer; an anode contact comprising a first anode region and a second anode region separated by a gap, the first anode region on a top surface of the mesa, the second anode region adjacent the first anode region; a switch connecting the first anode region and the second anode region; and a cathode contact adjacent the anode contact and in electrical communication with the n-type layer.

Embodiment (b). The LED device of embodiment (a), wherein the first anode region has a first area and the second anode region has a second area, the second area larger than the first area.

Embodiment (c). The LED device of embodiments (a) to (b), wherein the gap has a width greater than about 1 micron.

Embodiment (d). The LED device of embodiments (a) to (c), further comprising a first dielectric layer in the gap.

Embodiment (e). The LED device of embodiments (a) to (d), further comprising a second dielectric layer on a top surface of the anode contact, and a mirror layer on a top surface of the first dielectric layer.

Embodiment (f). The LED device of embodiments (a) to (e), wherein the first dielectric layer and the second dielectric layer independently comprise one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

Embodiment (g). The LED device of embodiments (a) to (f), wherein the mirror layer comprises one or more of aluminum (Al), silver (Ag), gold (Au), copper (Cu), metallic nitrides and alloys thereof.

Embodiment (h). The LED device of embodiments (a) to (g), wherein the first anode region and the second anode region independently comprise a material selected from one or more of silver (Ag), indium tin oxide (ITO), nickel (Ni), palladium (Pd), platinum (Pt), and zinc oxide (ZnO).

Embodiment (i). The LED device of embodiments (a) to (h), further comprising an anode terminal on the anode contact, a cathode terminal on the cathode contact, and a switch terminal on the switch.

Embodiment (j). A method of operating the LED device of embodiments (a) to (i), the method comprising: opening the switch; and flowing a current through the anode contact to the first anode region to emit light having a centroid wavelength less than 590 nm.

Embodiment (k). A method of operating the LED device of embodiments (a) to (i), the method comprising: closing the switch; and flowing a current through the anode contact to the first anode region and to the second anode region to emit light having a centroid wavelength greater than 610 nm.

Embodiment (l). A light emitting diode (LED) device comprising: a mesa array comprising a first mesa and a second mesa separated by a trench, the first mesa and the second mesa comprising semiconductor layers, the semiconductor layers including an n-type layer, an active layer, and a p-type layer, the trench having at least one side wall and extending to the n-type layer, the first mesa having a first width and the second mesa having a second width, the first width greater than the second width; a first anode contact on a top surface of the first mesa; a second anode contact on a top surface of the second mesa; and a cathode contact adjacent the first mesa and adjacent the second mesa.

Embodiment (m). The LED device of embodiment (l), wherein the first anode contact and the second anode contact independently comprise a material selected from one or more of silver (Ag), indium tin oxide (ITO), nickel (Ni), palladium (Pd), platinum (Pt), and zinc oxide (ZnO).

Embodiment (n). The LED device of embodiments (l) to (m), further comprising a first anode terminal on the first anode contact, a second anode terminal on the second anode contact, and a cathode terminal on the cathode contact.

Embodiment (o). The LED device of embodiments (l) to (n), further comprising a dielectric layer on the at least one sidewall of the trench.

Embodiment (p). The LED device of embodiments (l) to (o), wherein the dielectric layer comprises one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

Embodiment (q). A method of operating the LED device of embodiments (l) to (p), the method comprising: flowing a current through the first anode contact to emit light having a centroid wavelength less than 590 nm.

Embodiment (r). A method of operating the LED device of embodiments (l) to (p), the method comprising: flowing a current through the second anode contact to emit light having a centroid wavelength greater than 610 nm.

Embodiment (s). A light emitting diode (LED) device comprising: a first mesa array comprising a plurality of first mesas separated by a first trench, the first trench filled with a dielectric layer; a second mesa array comprising a plurality of second mesas separated by a second trench, the second trench filled with the dielectric layer; a first anode contact on a top surface of the first mesa array; a second anode contact on a top surface of the second mesa array; and a cathode contact adjacent to the first mesa array and the second mesa array, the plurality of first mesas and the plurality of second mesas comprising semiconductor layers, the semiconductor layers including an n-type layer, an active layer, and a p-type layer, and the first trench and the second trench extending to the n-type layer.

Embodiment (t). The LED device of embodiment (s), wherein the first anode contact and the second anode contact independently comprise a material selected from one or more of silver (Ag), indium tin oxide (ITO), nickel (Ni), palladium (Pd), platinum (Pt), and zinc oxide (ZnO).

Embodiment (u). The LED device of embodiments (s) to (t), further comprising a first anode terminal on the first anode contact, a second anode terminal on the second anode contact, and a cathode terminal on the cathode contact.

Embodiment (v). The LED device of embodiments (s) to (u), wherein the dielectric layer comprises one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

Embodiment (w). A method of operating the LED device of embodiments (s) to (v), the method comprising: flowing a current through the first anode contact to emit light having a centroid wavelength less than 590 nm.

Embodiment (x). A method of operating the LED device of embodiments (s) to (v), the method comprising: flowing a current through the second anode contact to emit light having a centroid wavelength greater than 610 nm.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode (LED) device comprising:
    a mesa comprising semiconductor layers, the semiconductor layers including an n-type layer, an active layer, and a p-type layer;
    an anode contact comprising a first anode region and a second anode region separated by a gap, the first anode region on a top surface of the mesa, the second anode region adjacent the first anode region;
    a switch connecting the first anode region and the second anode region; and
    a cathode contact adjacent the anode contact and in electrical communication with the n-type layer.

2. The LED device of claim 1, wherein the first anode region has a first area and the second anode region has a second area, the second area larger than the first area.

3. The LED device of claim 1, wherein the gap has a width greater than about 1 micron.

4. The LED device of claim 3, further comprising a first dielectric layer in the gap.

5. The LED device of claim 4, further comprising a second dielectric layer on a top surface of the anode contact, and a mirror layer on a top surface of the first dielectric layer.

6. The LED device of claim 5, wherein the first dielectric layer and the second dielectric layer independently comprise one or more of silicon oxide ($SiO_2$), aluminum oxide ($Al_2O_3$), silicon nitride (SiNx), titanium oxide ($TiO_2$), niobium oxide ($Nb_2O_5$), zirconium oxide ($ZrO_2$), and hafnium oxide ($HfO_2$).

7. The LED device of claim 5, wherein the mirror layer comprises one or more of aluminum (Al), silver (Ag), gold (Au), copper (Cu), metallic nitrides and alloys thereof.

8. The LED device of claim 1, wherein the first anode region and the second anode region independently comprise a material selected from one or more of silver (Ag), indium tin oxide (ITO), nickel (Ni), palladium (Pd), platinum (Pt), and zinc oxide (ZnO).

9. The LED device of claim 1, further comprising an anode terminal on the anode contact, a cathode terminal on the cathode contact, and a switch terminal on the switch.

10. A method of operating the LED device of claim 1, the method comprising:
   opening the switch; and
   flowing a current through the anode contact to the first anode region to emit light having a centroid wavelength less than 590 nm.

11. A method of operating the LED device of claim 1, the method comprising:
   closing the switch; and
   flowing a current through the anode contact to the first anode region and to the second anode region to emit light having a centroid wavelength greater than 610 nm.

* * * * *